(12) United States Patent
Olleres et al.

(10) Patent No.: US 11,495,525 B2
(45) Date of Patent: Nov. 8, 2022

(54) ELECTRONIC MODULE HAVING A GROOVE ANCHORING TERMINAL PINS

(71) Applicant: Hong Kong Applied Science and Technology Research Institute Company, Limited, Hong Kong (HK)

(72) Inventors: Lourdito M. Olleres, Hong Kong (HK); Shi Wo Chow, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 134 days.

(21) Appl. No.: 17/190,592

(22) Filed: Mar. 3, 2021

(65) Prior Publication Data
US 2022/0285253 A1   Sep. 8, 2022

(51) Int. Cl.
*H01L 23/498* (2006.01)
*H01L 21/56* (2006.01)
(Continued)

(52) U.S. Cl.
CPC .... *H01L 23/49805* (2013.01); *H01L 21/4853* (2013.01); *H01L 21/561* (2013.01);
(Continued)

(58) Field of Classification Search
CPC ........... H01L 23/49805; H01L 23/3107; H01L 23/49822; H01L 21/4853; H01L 21/561;
(Continued)

(56) References Cited

U.S. PATENT DOCUMENTS

| 6,137,064 A | 10/2000 | Kiani et al. |
| 7,246,434 B1 * | 7/2007 | Taylor .................. H05K 3/3442 29/830 |

(Continued)

FOREIGN PATENT DOCUMENTS

| CN | 101488495 A | 7/2009 |
| CN | 105609473 A | 5/2016 |

(Continued)

OTHER PUBLICATIONS

ISR and Written Opinion, PCT/CN2021/080827, dated Jun. 28, 2021.

*Primary Examiner* — Marc Anthony Armand
(74) *Attorney, Agent, or Firm* — Stuart T. Auvinen; gPatent LLC

(57) ABSTRACT

A module has electronic components mounted to a Printed Circuit Board (PCB) with multiple patterned conductive layers connecting to conductive slot metal around a conductive slot. A groove is cut through a top molding encapsulant above and into the conductive slot but does not cut through a bottom molding encapsulant. A terminal pin is inserted into the groove and pushed down into the conductive slot. When heated, embedded solder previously applied to the conductive slot metal flows between the end of the terminal pin and the conductive slot metal to form a solder bond. An end of the PCB past the conductive slot has no metal traces, preventing shorts. Epoxy can be placed into the groove around the terminal pin or a hole formed in the terminal pin to increase strength of the anchored terminal pin. The molding around the groove protects terminal pins from shorting from the side.

20 Claims, 17 Drawing Sheets

(51) Int. Cl.
    *H01L 21/48*     (2006.01)
    *H01L 23/31*     (2006.01)
    *H01L 25/18*     (2006.01)
    *H01L 25/065*     (2006.01)
    *H01L 25/07*     (2006.01)
    *H01L 25/16*     (2006.01)

(52) U.S. Cl.
    CPC ........ H01L 21/565 (2013.01); H01L 23/3107 (2013.01); H01L 23/49822 (2013.01); *H01L 25/0655* (2013.01); *H01L 25/072* (2013.01); *H01L 25/16* (2013.01); *H01L 25/18* (2013.01)

(58) Field of Classification Search
    CPC ... H01L 25/0655; H01L 25/072; H01L 25/16; H01L 25/18
    See application file for complete search history.

(56) References Cited

U.S. PATENT DOCUMENTS

| | | |
|---|---|---|
| 8,966,747 B2 | 3/2015 | Vinciarelli et al. |
| 9,402,319 B2 | 7/2016 | Vinciarelli et al. |
| 2007/0238324 A1 | 10/2007 | Ho |
| 2012/0287582 A1 | 11/2012 | Vinciarelli et al. |
| 2020/0043821 A1 | 2/2020 | Choi et al. |
| 2020/0182440 A1* | 6/2020 | Casanova ........... F21V 19/0005 |

FOREIGN PATENT DOCUMENTS

| | | |
|---|---|---|
| CN | 107170718 A | 9/2017 |
| EP | 3770959 A1 | 1/2021 |

* cited by examiner

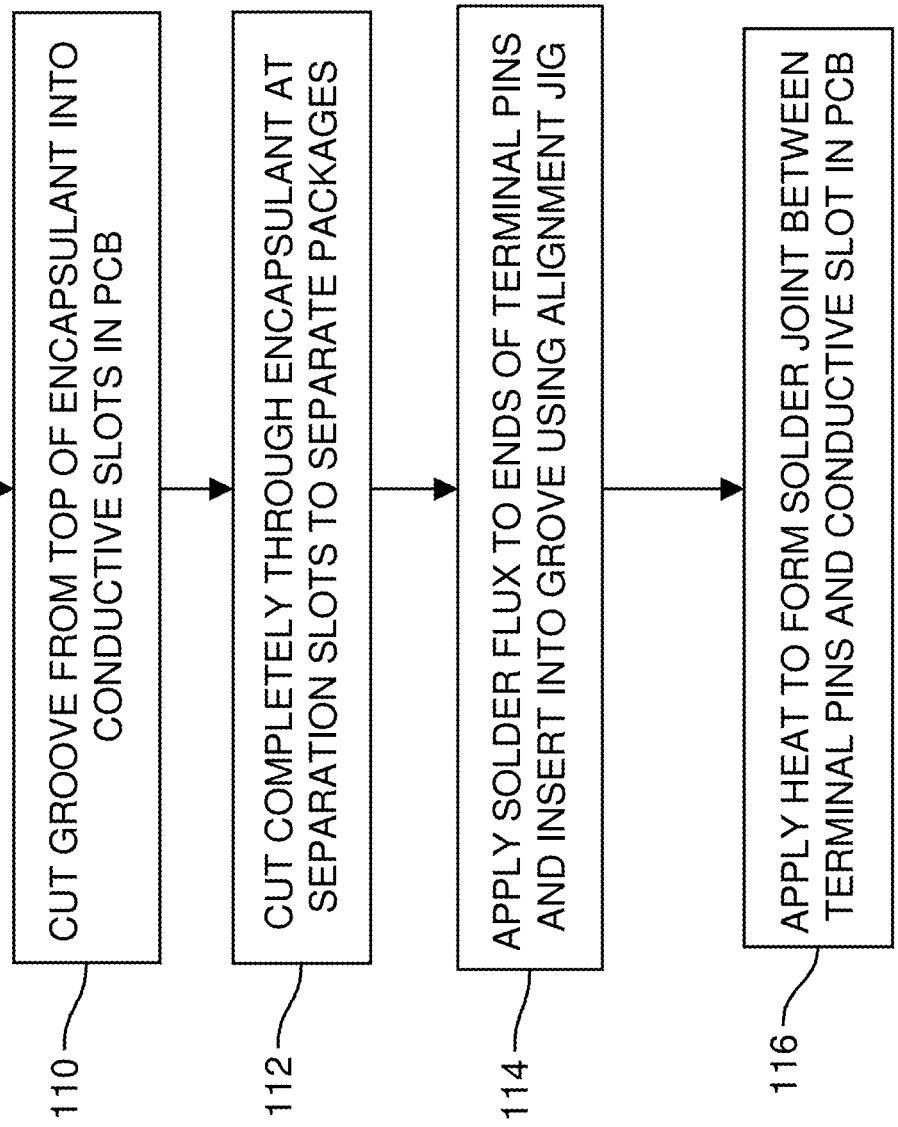

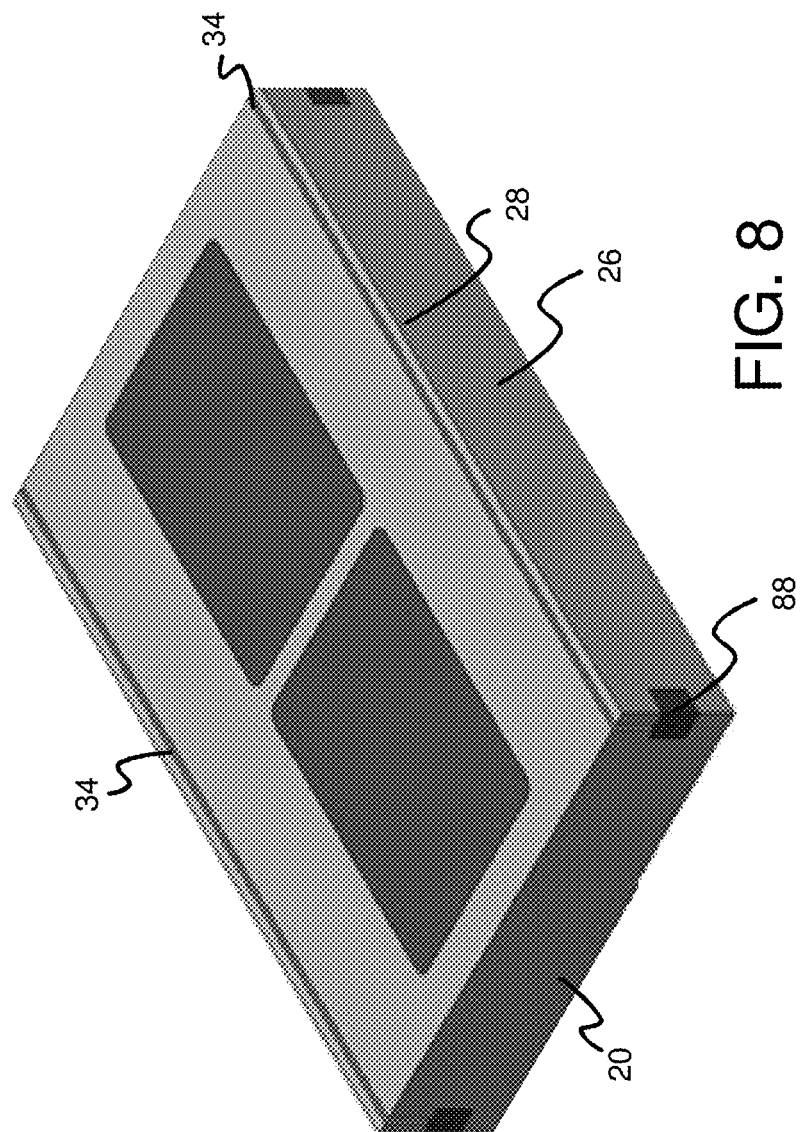

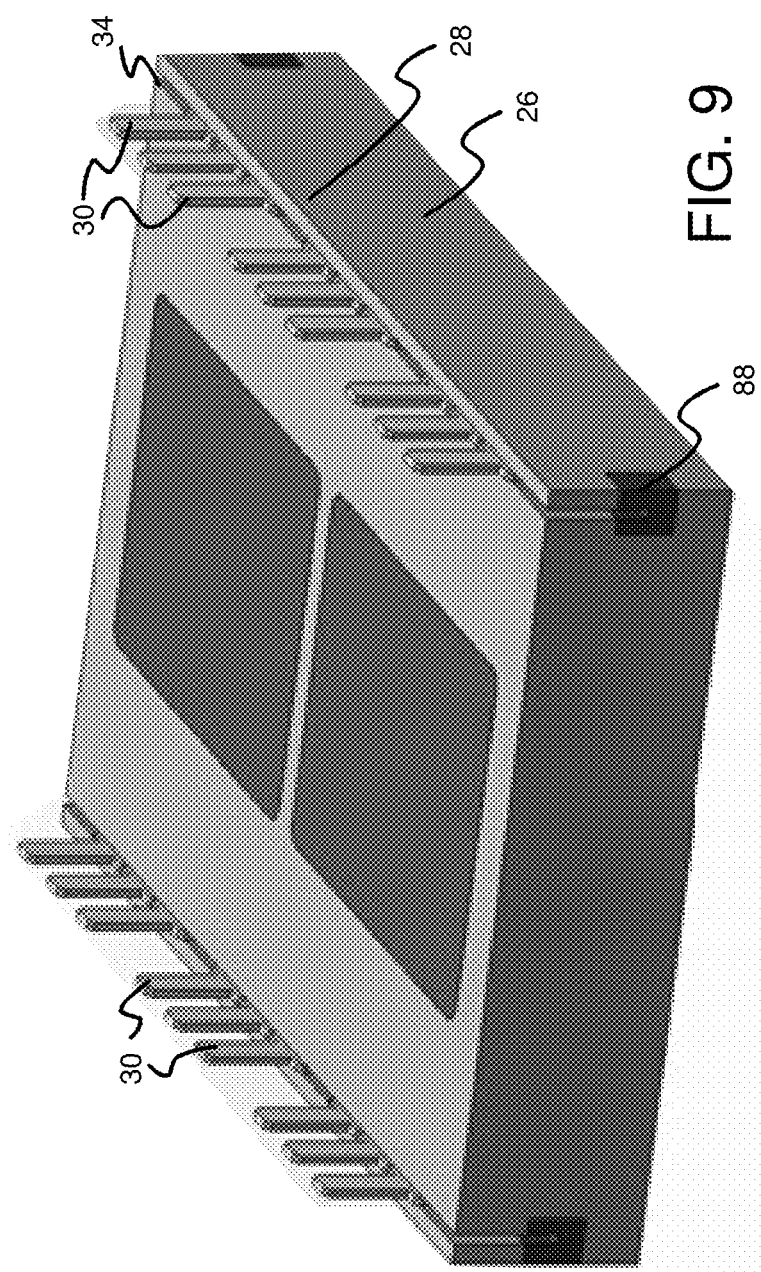

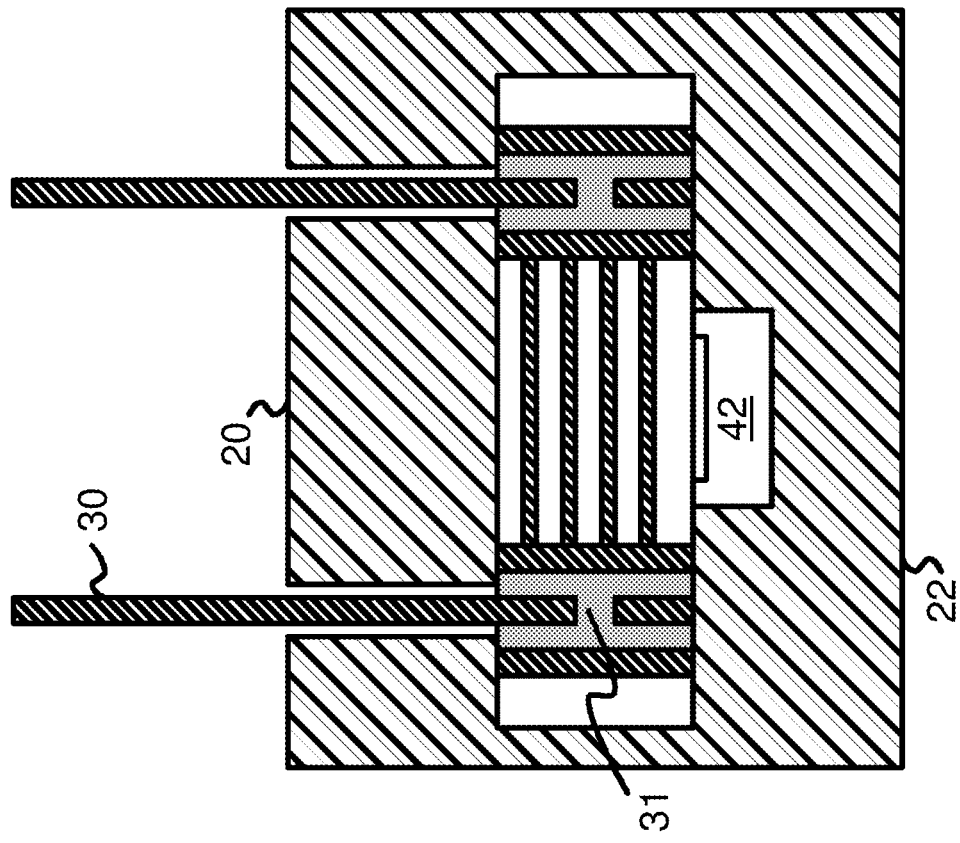

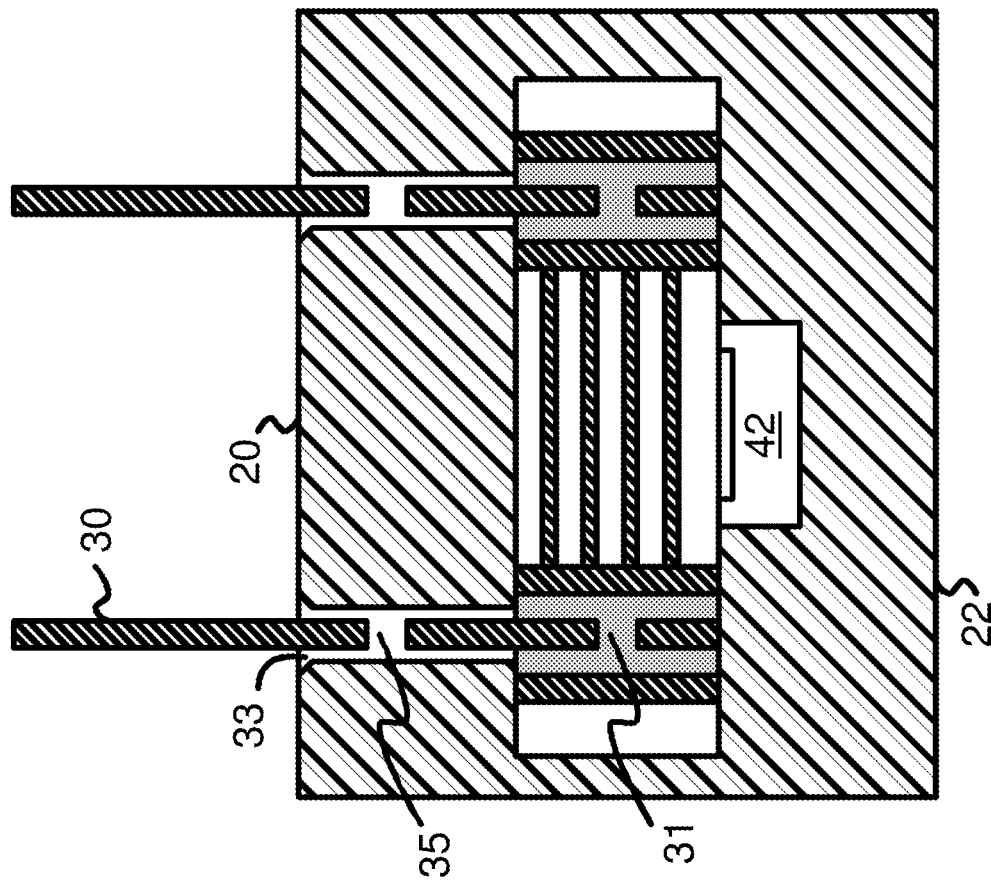
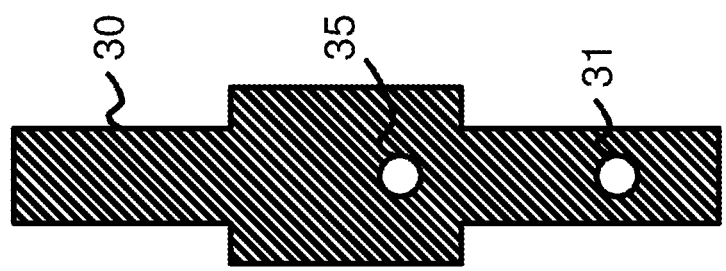
FIG. 14A
SIDE VIEW
FIG. 14B
CROSS-SECTION

US 11,495,525 B2

ELECTRONIC MODULE HAVING A GROOVE ANCHORING TERMINAL PINS

FIELD OF THE INVENTION

This invention relates to electronic device packaging, and more particularly to modules with anchored terminal pins.

BACKGROUND OF THE INVENTION

Semiconductor devices such as Integrated Circuits (ICs) are individually encapsulated in rigid plastic or ceramic and provided with leads, solder balls, or pins for making electrical connection. Various modules having more than one IC are also available. Some modules may contain several encapsulated IC's along with other components such as resistors, capacitors, and inductors, all mounted on a small substrate such as a Printed Circuit Board (PCB).

FIG. 1 shows a prior-art module with side pins. Module 10 may be a small PCB with electronic components such as IC's, resistors, capacitors, etc. mounted thereon and surrounded by an encapsulant such as rigid plastic. Terminal pins 18 are attached to the edge of this PCB to provide electrical connection to wiring traces on the module's PCB. Terminal pins 18 may be placed along 2 sides of module 10 as shown, or may be placed on all four sides, or in other arrangements.

FIG. 2 is a cross-section of a prior-art module with side-attached terminal pins. PCB 50 has conductive layers 46 sandwiched between insulating board layers 56 in a multi-layer board. Conductive layers 46 can be metal layers patterned to form wiring traces, with vias or other connections between layers. Encapsulant 21 is molded around PCB 50 and any components mounted on PCB 50.

The edge of PCB 50 can be provided with metal pad 92 that connects to one or more of conductive layers 46. Solder can be placed on metal pad 92 to allow terminal pin 18 to attached when the solder is heated.

When a lateral force is applied to the unattached end of terminal pin 18, the solder connection may crack and terminal pin 18 may detach or break off from module 10. Even if terminal pin 18 does not completely break off, there may be cracks formed in the solder connection or in other parts of module 10 that can cause reliability problems. Also, when module 10 is attached to a larger PCB such as a motherboard, or inserted into a socket or into holes in a PCB, the insertion force exerted on terminal pin 18 may cause cracks in the solder connection to metal pad 92 resulting in reliability problems.

Another problem is that the sides of terminal pins 18 are exposed and may make electrical contact with other components, resulting in shorting. When module 10 is a power device generating high voltages and currents, such shorting may be dangerous and result in damage and accidental electrocution.

While modules are useful, it is desired to improve the mechanical strength of the connection of terminal pins to the module. It is desired to improve safety and reduce accidental shorting by covering the sides of the terminal pins. It is desired to improve rigidity and reliability of the module by a better attachment of the terminal pins to the module's PCB.

BRIEF DESCRIPTION OF THE DRAWINGS

FIGS. 6A-6B show an assembly flow for making the grooved modules.

FIG. 8 is a 3-D view of a module with a groove before insertion of terminal pins.

FIG. 9 is a 3-D view of a module with a groove after insertion of terminal pins.

FIGS. 10A-10B is an alternative with a hole in the terminal pins.

FIGS. 14A-14B is an alternative with two holes in the terminal pins.

DETAILED DESCRIPTION

The present invention relates to an improvement in electronic modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
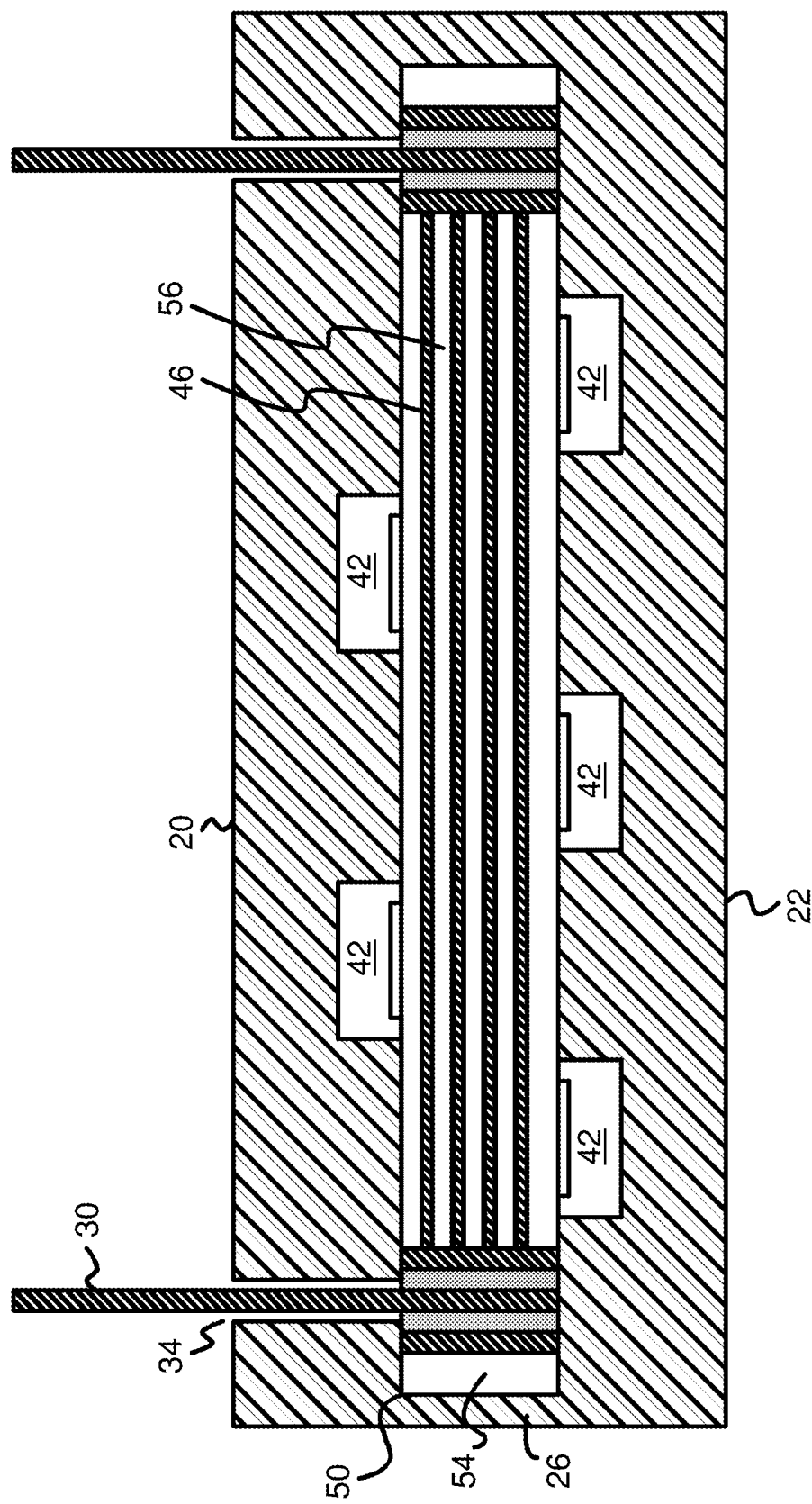
FIG. 3 is a cross-sectional diagram of a module with a pin-protecting groove.

FIG. 3 is a cross-sectional diagram of a module with a pin-protecting groove. Components 42 are mounted to the surfaces of PCB 50 and make electrical contacts with patterns of wiring traces in conductive layers 46. Vias and through-holes connect the different layers of conductive layers 46. Components 42 can include packaged IC's including power IC's, power transistors, transformers, inductors, resistors, capacitors, etc. PCB is a multi-layer board with conductive layers 46 that are patterned and formed between board layers 56 that can be fiberglass or other insulating substrate layers.

Conductive slots are provided near the ends of PCB 50. These conductive slots have metal formed on the slot edges or PCB sidewalls. Solder is placed on these metal edges of the slots, leaving a hole in the middle to accept terminal pin 30 when terminal pin 30 is inserted into the slot. Once heated, the solder forms a bond between the end of terminal pins 30 and the metal edges of the slots. Patterns in conductive layers 46 connect desired signal traces to the metal edges of the slots and thus to terminal pins 30.

PCB ends 54 have no wiring traces formed in conductive layers 46, so there are no metal traces in PCB ends 54. Having no metal in PCB ends 54 provides an extra insulating buffer between terminal pins 30 and external devices and persons that might touch the module.

Top molding 20 and bottom molding 22 are formed over PCB 50 and components 42 to encapsulate them. Top and bottom molds may be heated and pressed together around PCB 50 and plastic inserted to form top molding 20 and bottom molding 22, with molding interlock 26 forming between top molding 20 and bottom molding 22 as plastic is extruded or forced around the edges and ends of PCB 50.

Grooves 34 are cut into top molding 20 and are located over the conductive slots in PCB 50. Terminal pins 30 are inserted into grooves 34 and into the conducting slot in PCB 50 and then heated to form a solder joint between terminal pins 30 and PCB 50.

Figure 4:
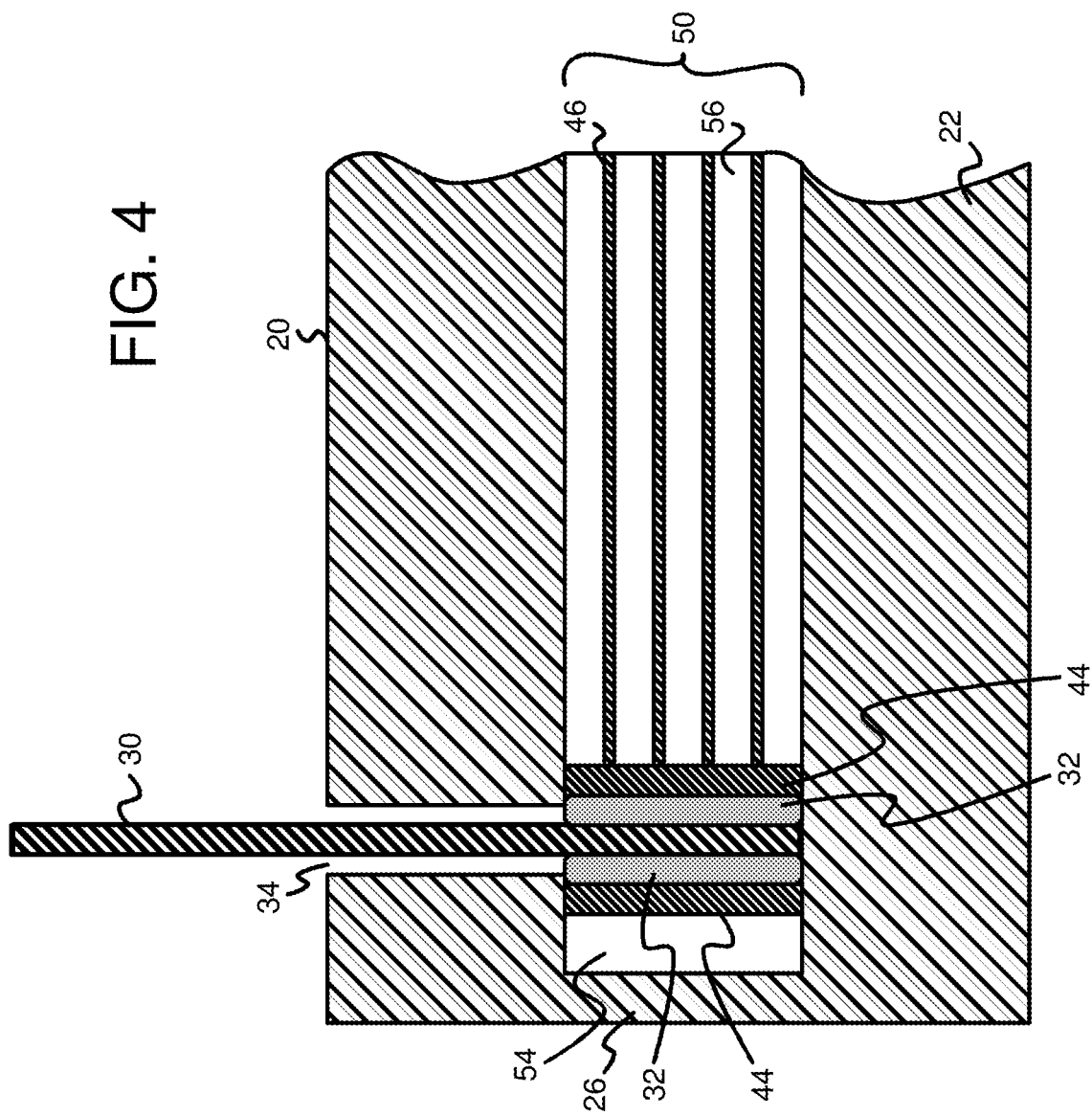
FIG. 4 shows a conductive slot soldered to a terminal pin in more detail.

FIG. 4 shows a conductive slot soldered to a terminal pin in more detail. PCB 50 is formed by conductive layers 46 between board layers 56. Conductive layers 46 are patterned to form wiring traces (patterns are not shown). Plastic is formed around PCB 50 to form top molding 20 and bottom molding 22 encapsulating PCB 50 and its components.

Conductive slots are formed in PCB 50 and have conductive slot metal 44 formed on the edges of PCB 50 inside these conductive slots. Embedded solder 32 is applied to the inner surfaces of conductive slot metal 44.

Groove 34 is formed in top molding 20. Groove 34 is formed directly over the conducting slot in PCB 50. Groove 34 may be centered over the center of the conductive slot.

During manufacturing, the lower end of terminal pin 30 is inserted into groove 34 and into the middle of the conductive slot in PCB 50. The heat is applied to cause embedded solder 32 to flow between conductive slot metal 44 and terminal pin 30, forming a solder joint. This solder joint surrounds terminal pin 30 to form a rigid bond that anchors the end of terminal pin 30 into the conductive slot.

Since the lower portion of terminal pin 30 is inserted into groove 34, top molding 20 prevents contact with the lower side of terminal pin 30, preventing accidental shorts from the side of the module. PCB ends 54 further protect the lower sides of terminal pin 30 from being touched by an external object, blocking external shorts. Also, PCB ends 54 have no metal traces, so electricity cannot easily arc across molding interlock 26 to an external conductor during a short. PCB ends 54 can be a portion of PCB 50 that has all metal in conductive layers 46 removed.

Figure 1:
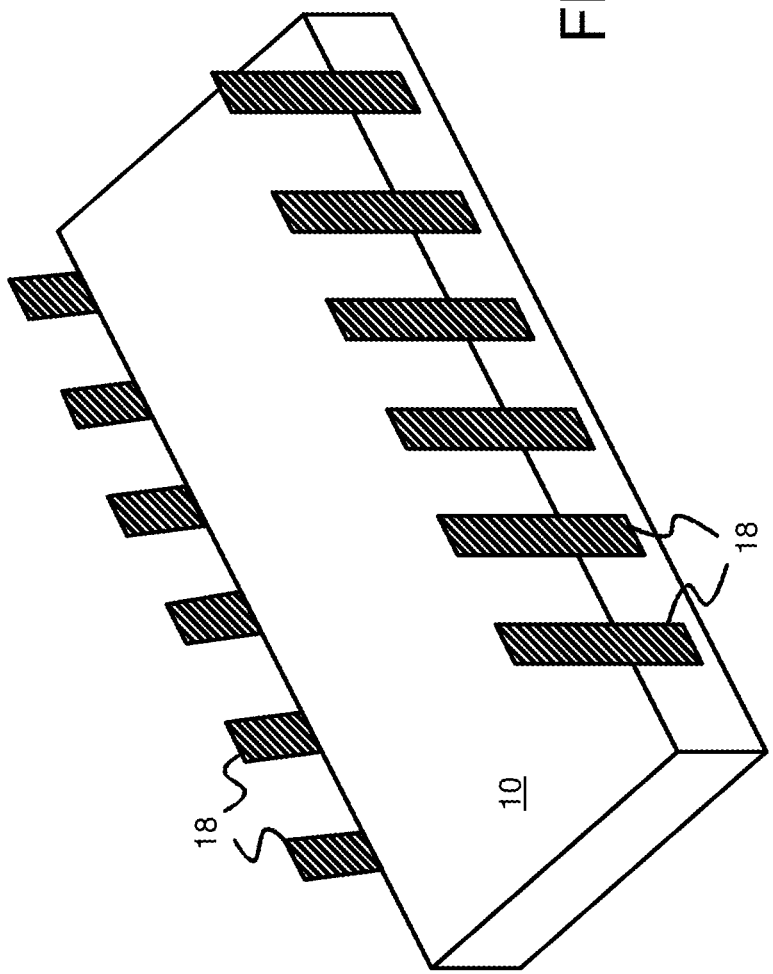
FIG. 1 shows a prior-art module with side pins.
Figure 2:
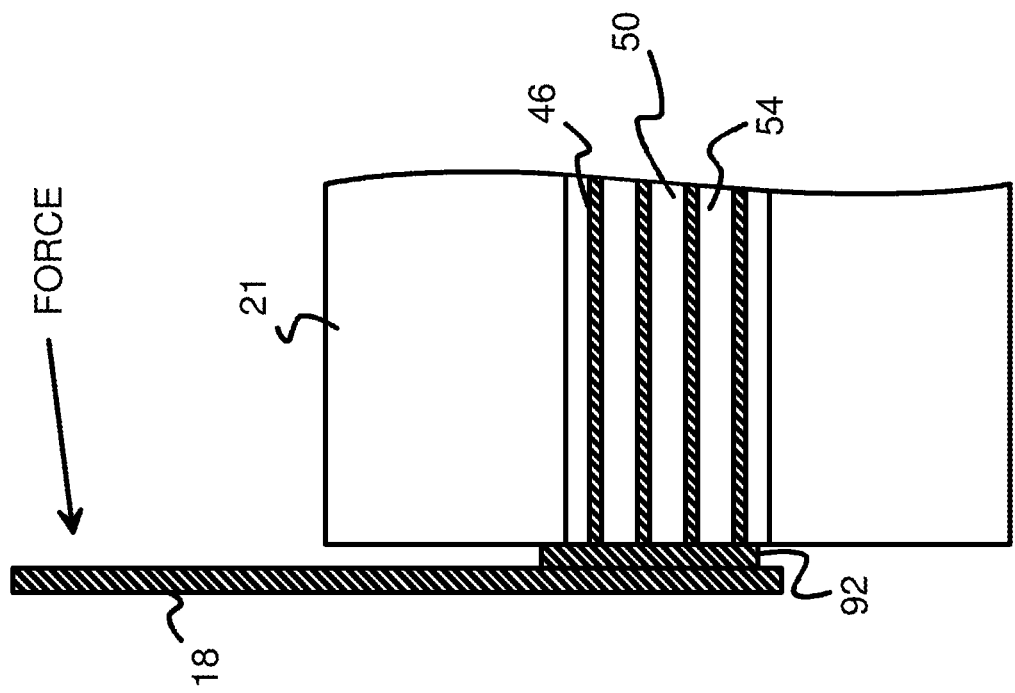
FIG. 2 is a cross-section of a prior-art module with side-attached terminal pins.

Breakage of the solder joint to terminal pin 30 is inhibited by groove 34, since an external lateral force applied to the top end of terminal pin 30 can only move terminal pin 30 within groove 34. Large displacements are prevented when groove 34 is not much larger than terminal pin 30. Reliability is improved with the lower risk of cracks in the solder joint. Also, since conductive slot metal 44 is a hole that terminal pin 30 fits through, the solder joint is on all sides of terminal pin 30 rather than just on the right side of terminal pin 18 of FIG. 2. Thus, terminal pin 30 is more firmly anchored to PCB 50, reducing breakage and reliability problems. Thermal and electrical conduction are also improved.

Figure 5:
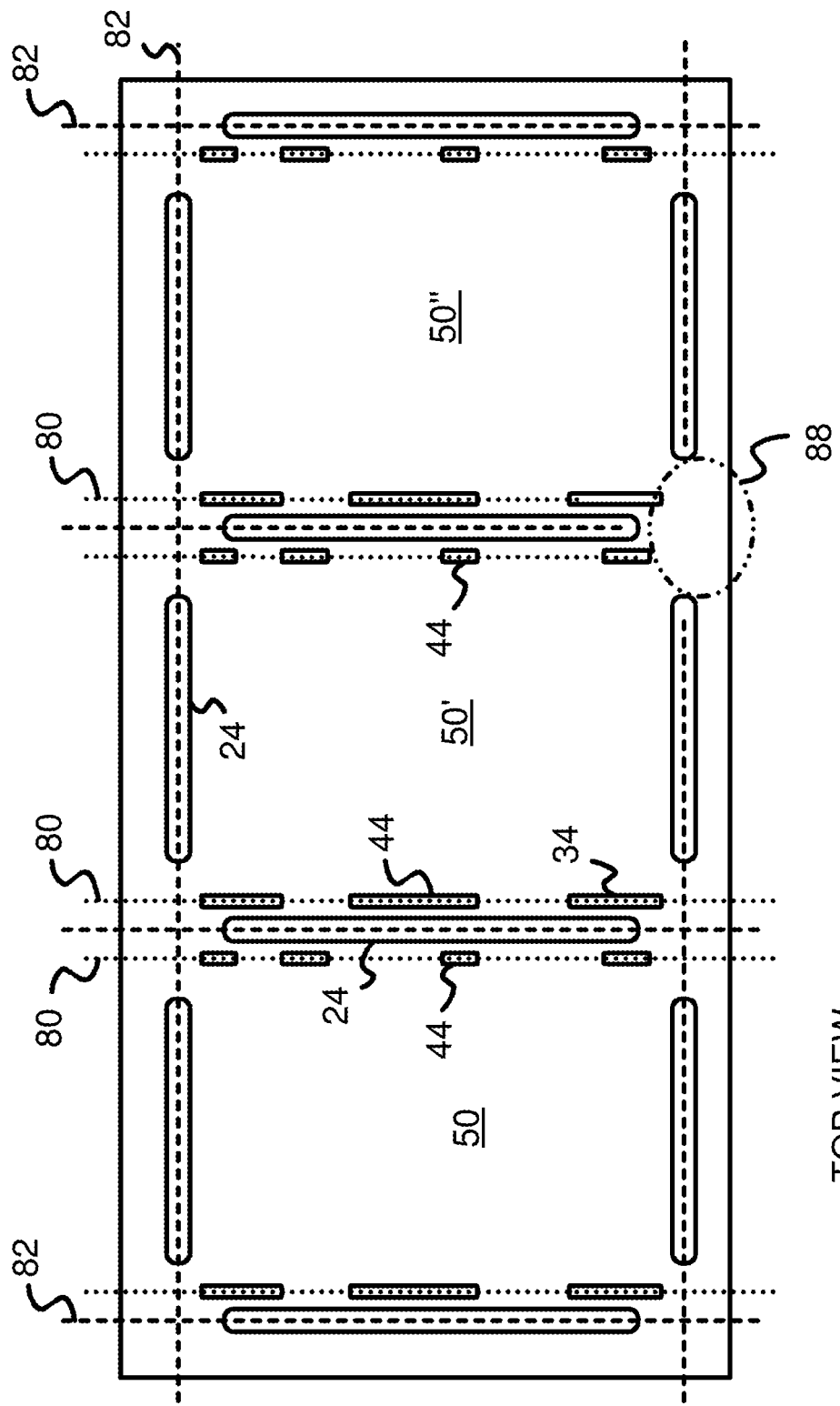
FIG. 5 is a top view of several modules being manufactured together before separation and groove sawing.

FIG. 5 is a top view of several modules being manufactured together before separation and groove sawing. Many modules may be manufactured together and later separated, such as by sawing along singulation lines 82. A large PCB or panel PCB can include regions that will later be separated to form different modules, each with PCB 50, 50', 50" cut from the panel PCB. FIG. 5 shows the panel PCB before encapsulation.

Encapsulant channel slots 24 are formed along singulation lines 82. During molding, plastic from top molding 20 and bottom molding 22 are forced into encapsulant channel slots 24 to form molding interlock 26 along the sides of the module. Conductor-free corner regions 88 are formed at the corners of the modules, where encapsulant channel slots 24 end before the corner. Conductor-free corner regions 88 provide mechanical support to keep the multiple modules together during manufacturing before separation. Conductor-free corner regions 88 are exposed edges of the final modules, so no metal conductors are formed in these regions to prevent shorting.

The conductive slots that have conductive slot metal 44 on their perimeter appear as several slots in the top view rather than a continuous slot along the entire length of the module. However, groove 34 (not shown) is a continuous slot in top molding 20 (not shown) that is formed by sawing along groove lines 80. The depth of the saw cut along groove lines 80 is only as deep as top molding 20 and PCB 50 but is not deep enough to go through bottom molding 22. The saw cut for singulation lines 82 is deeper, cutting completely through the module, including top molding 20, PCB 50, and bottom molding 22.

Figure 6A:
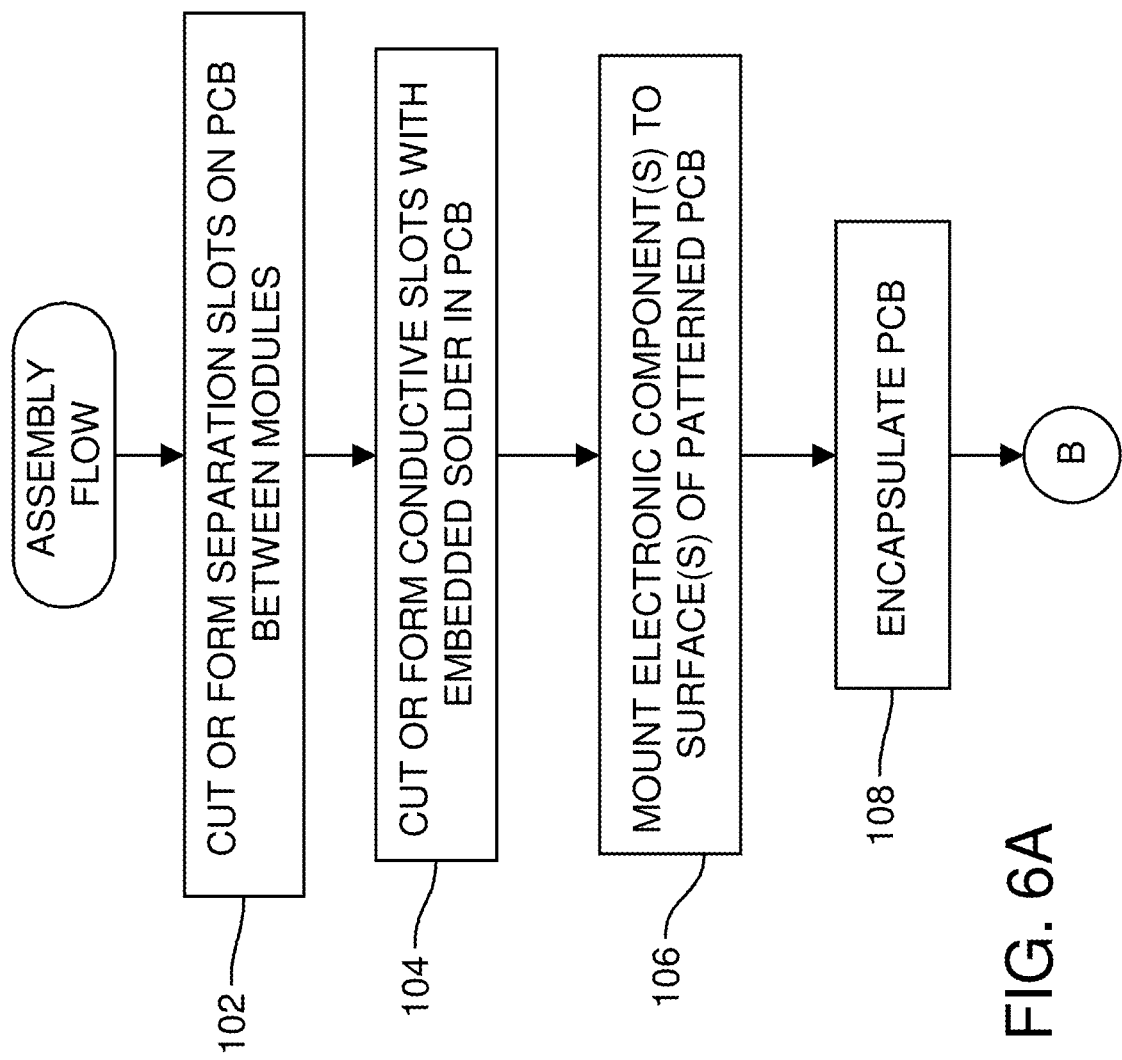

FIGS. 6A-6B show an assembly flow for making the grooved modules. In FIG. 6A, the panel PCB is manufactured and includes patterns formed on conductive layers 46, mounting pads and holes, and vias between layers. encapsulant channel slots 24 are formed along the edges of each module, step 102, and conductive slots with conductive slot metal 44 surrounding each conductive slot are also formed, step 104. These steps may be integrated with manufacture of the panel PCB rather than after PCB manufacture is completed.

Components 42 are placed on surfaces of PCB 50 or otherwise mounted, such as by inserting pins of components 42 into holes in PCB or onto pads on PCB 50, step 106. Solder flux or solder paste may be applied before components 42 are placed. Soldering heat is applied to bond components 42 to PCB 50.

PCB 50 with components 42 mounted to it are encapsulated, step 108. Encapsulation can be performed in a variety of ways, such as by fitting a top mold and a bottom mold around PCB 50, and then inserting hot plastic and applying pressure to squeeze the plastic around PCB 50 to form top molding 20, bottom molding 22, and molding interlock 26.

In FIG. 6B, groove 34 is formed by sawing along groove lines 80 with a partial depth that includes cutting through top molding 20 and embedded solder 32 in the connecting slots in PCB 50, but not through bottom molding 22, step 110. Then modules are separated from other modules in the panel PCB by sawing along singulation lines 82, step 112. The saw depth is deep enough to cut completely through top molding 20, PCB 50, and bottom molding 22.

Solder flux is applied to the ends of terminal pins 30, and terminal pins 30 are inserted through groove 34 into the conductive slots in PCB 50, step 114. An alignment jig can be used to assist with inserting terminal pins 30 into the conductive slots so that conductive slot metal 44 touches the solder flux on terminal pins 30. When heat is applied, step 116, a solder joint is formed between terminal pins 30 and conductive slot metal 44 as embedded solder 32 melts and flows between conductive slot metal 44 and terminal pins 30.

Figure 7A:
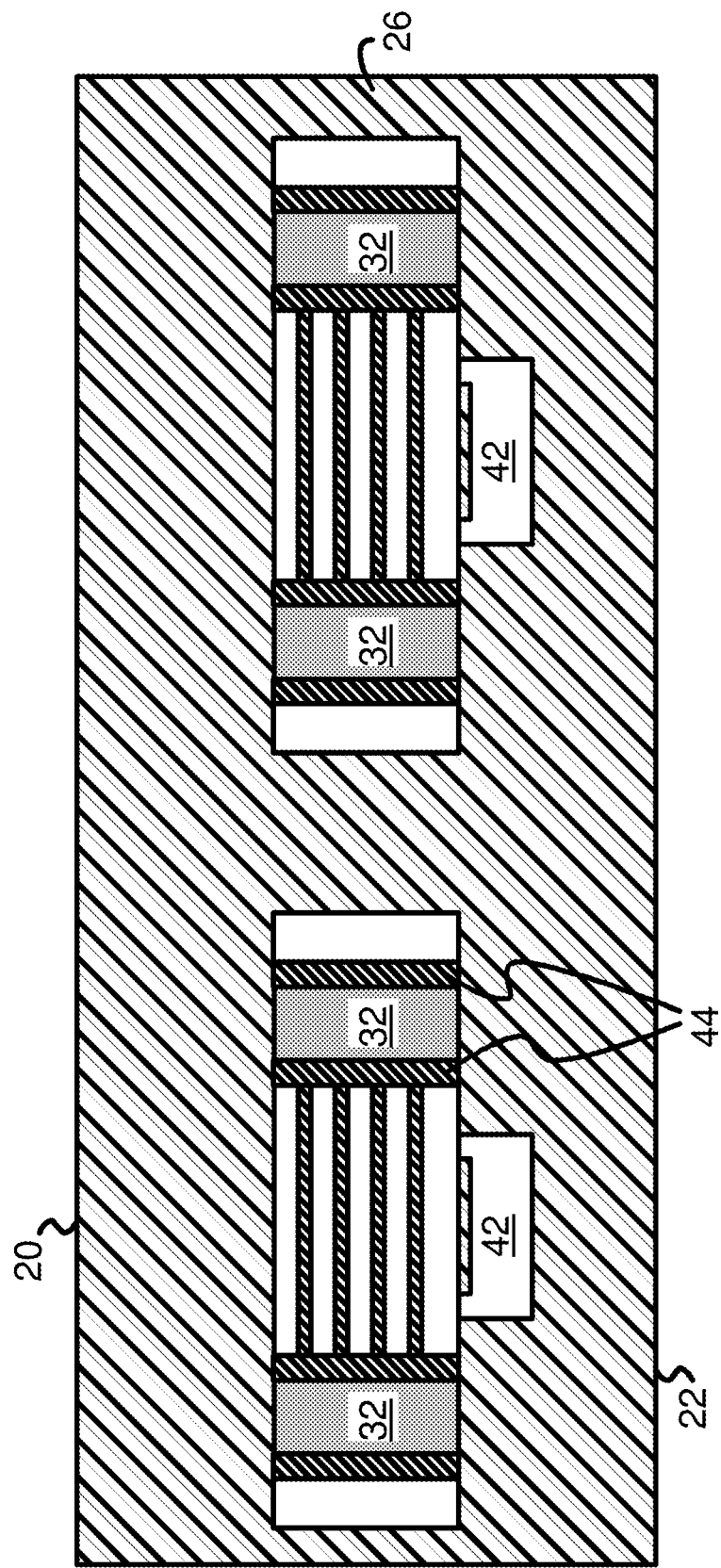
FIGS. 7A-7C show cross-sectional views at different steps in the manufacturing process.
Figure 7B:
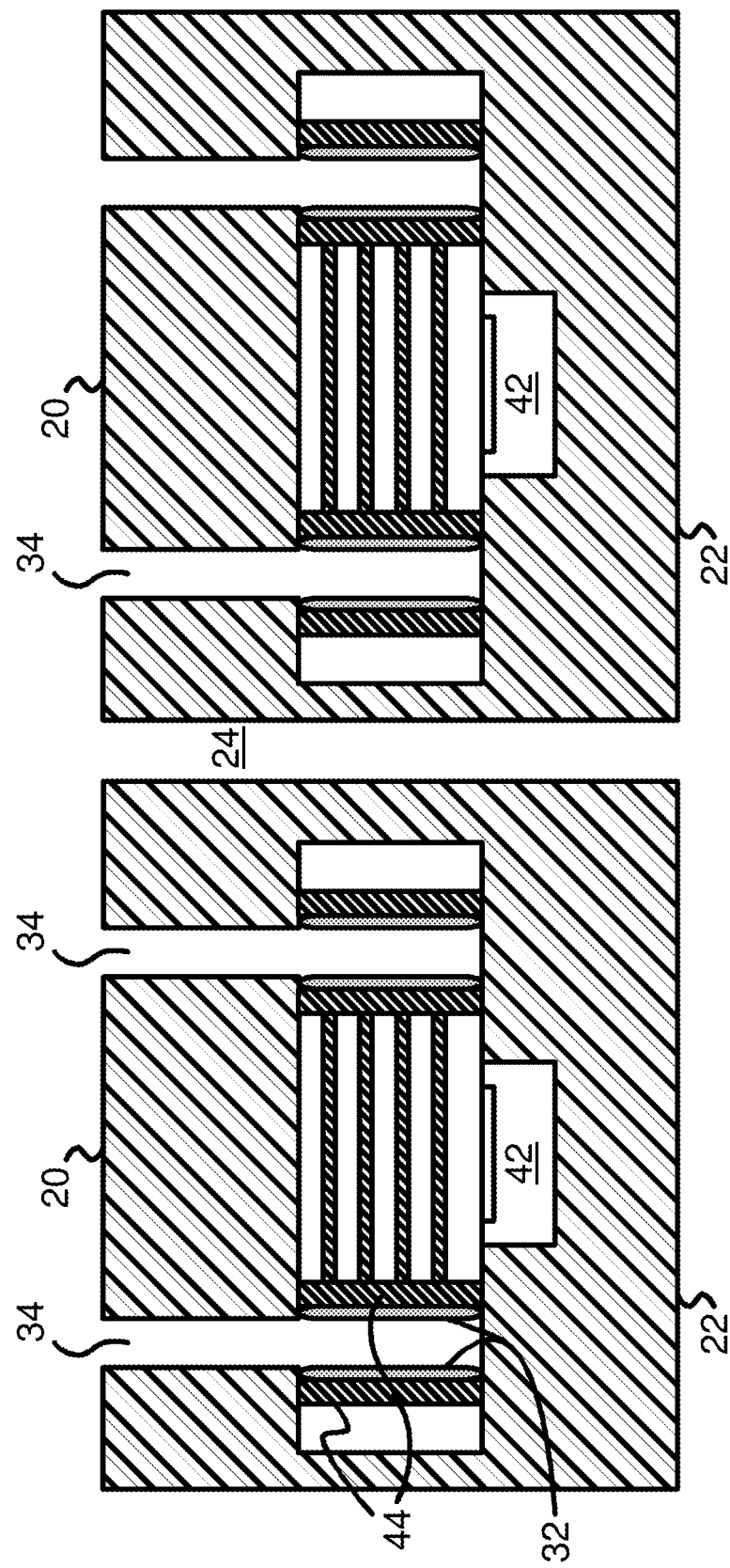
Figure 7C:
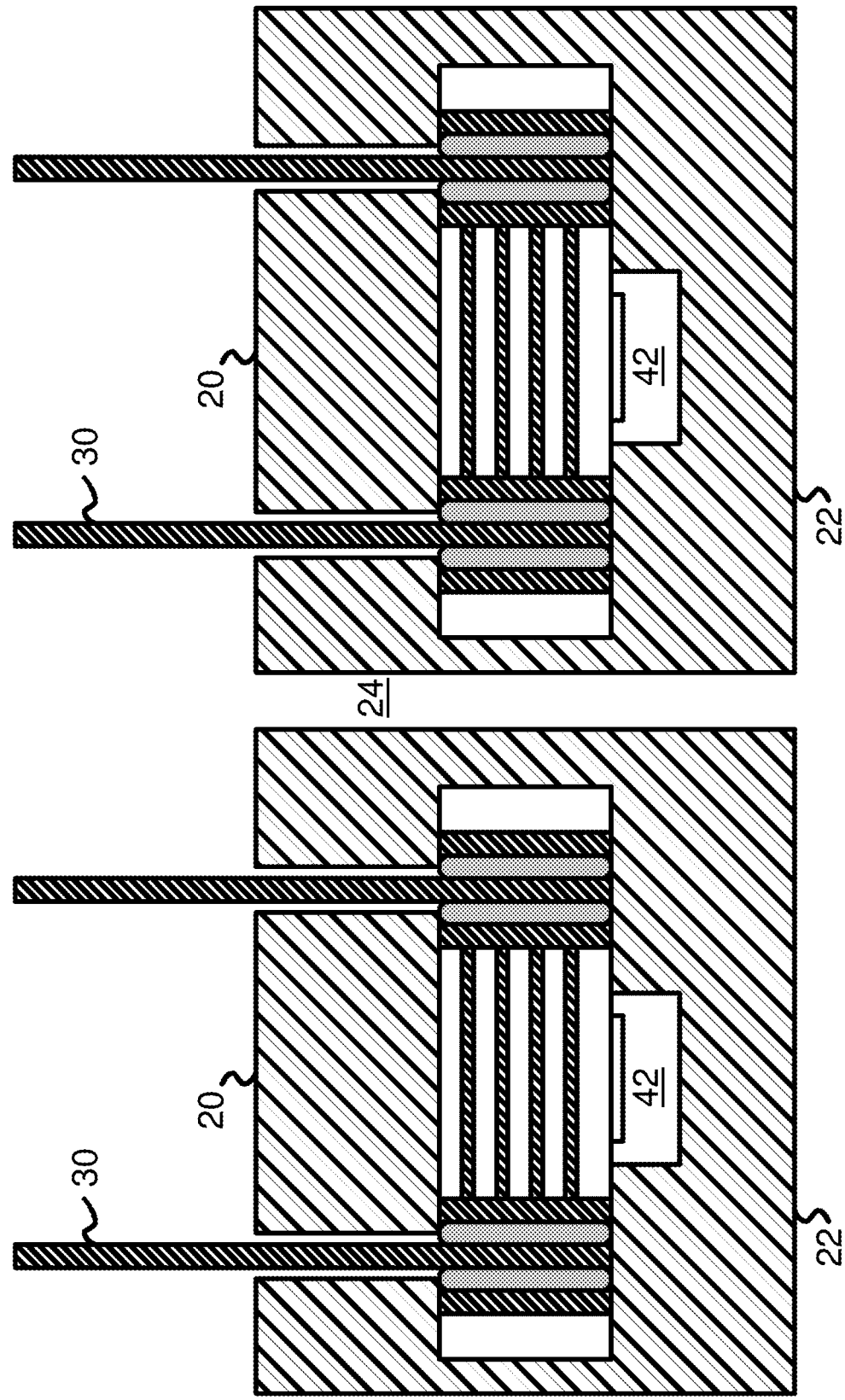

FIGS. 7A-7C show cross-sectional views at different steps in the manufacturing process. In FIG. 7A, after step 108 (FIG. 6A), top molding 20, bottom molding 22, and molding interlock 26 have been formed around PCB 50 and components 42. Embedded solder 32 is placed into the conductive slots on the inner surfaces of conductive slot metal 44. There may be a hole in the middle of the conductive slot when embedded solder 32 does not completely fill the slot, or embedded solder 32 may completely fill the slot.

In FIG. 7B, after steps 110, 112 of FIG. 6B, modules have been separated by encapsulant channel slots 24 and sawing along singulation lines 82. Sawing along groove lines 80 (FIG. 5) creates grooves 34 that extend downward into the conducting slots when embedded solder 32 is cut into. Earlier, embedded solder 32 was applied to the inner surfaces of conductive slot metal 44.

In FIG. 7C, terminal pins 30 are inserted into grooves 34 and down into the conductive slots, as described for step 114 of FIG. 6B. In step 116, heating occurs, allowing embedded solder 32 to flow and form a rigid solder bond between terminal pins 30 and conductive slot metal 44.

FIG. 8 is a 3-D view of a module with a groove before insertion of terminal pins. Two grooves 34 are cut into the stop surface of the module into top molding 20. Conductor-free corner regions 88 are portions of PCB 50 that are visible in the corners, where encapsulant channel slots 24 (FIG. 5) do not reach. Molding interlock 26 is formed where encapsulant channel slots 24 were before encapsulation.

FIG. 9 is a 3-D view of a module with a groove after insertion of terminal pins. Terminal pins 30 have been inserted into the top of grooves 34 and into the conductive slots and soldered to conductive slot metal 44 within these conductive slots.

Buffer portion 28 of top molding 20 above molding interlock 26, between groove 34 and the edge of the module, provides a physical barrier to prevent touching terminal pins 30 that are inserted into groove 34, thus preventing shorts.

FIGS. 10A-10B is an alternative with a hole in the terminal pins. In FIG. 10A, hole 31 is formed in terminal pin 30, near the bottom of terminal pin 30 where terminal pin 30 fits inside the conductive slot. In FIG. 10B, when terminal pin 30 is inserted into groove 34 and into the conductive slot, hole 31 contacts embedded solder 32. When embedded solder 32 is heated to reflow and form the solder joint, some of embedded solder 32 flows into hole 31. The final solder joint may be stronger due to the anchoring effect of embedded solder 32 within hole 31.

Figure 11:
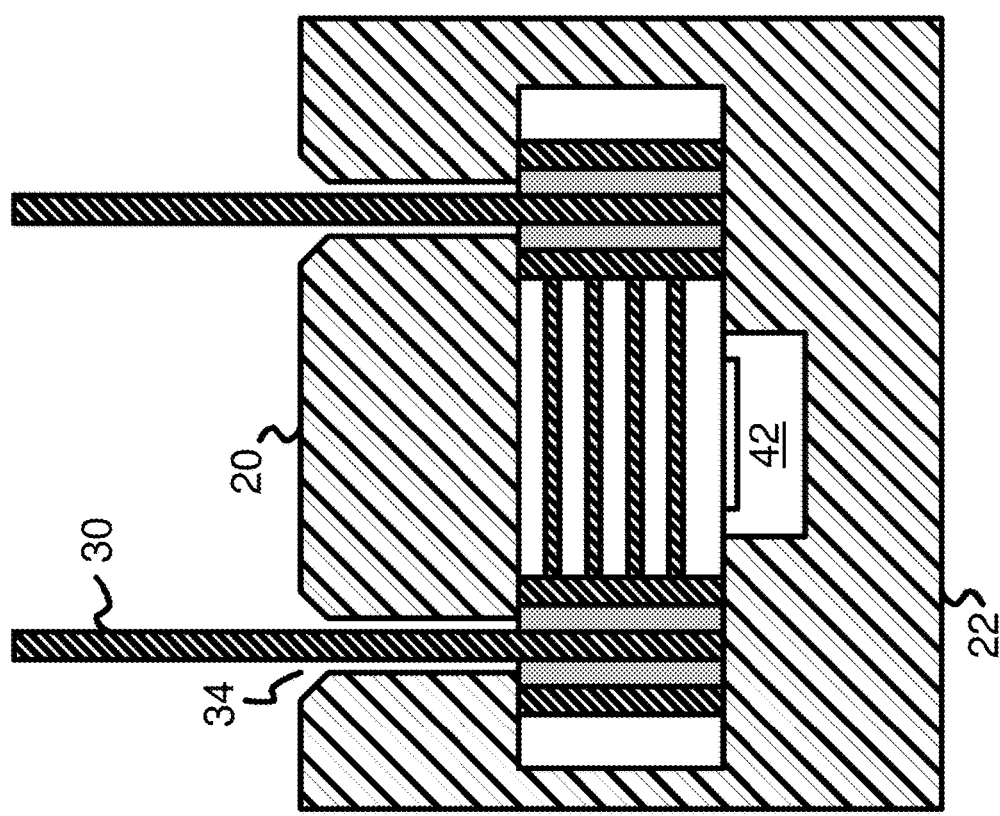
FIG. 11 is an alternative with a bevel cut at the top of the groove.

FIG. 11 is an alternative with a bevel cut at the top of the groove. When sawing groove lines 80 (FIG. 5), the saw apparatus may provide a wider cut at the top of groove 34, forming a bevel cut. This wider opening for groove 34 may be beneficial. Inserting terminal pins 30 into groove 34 may be facilitated by the bevel cut.

Figure 12:
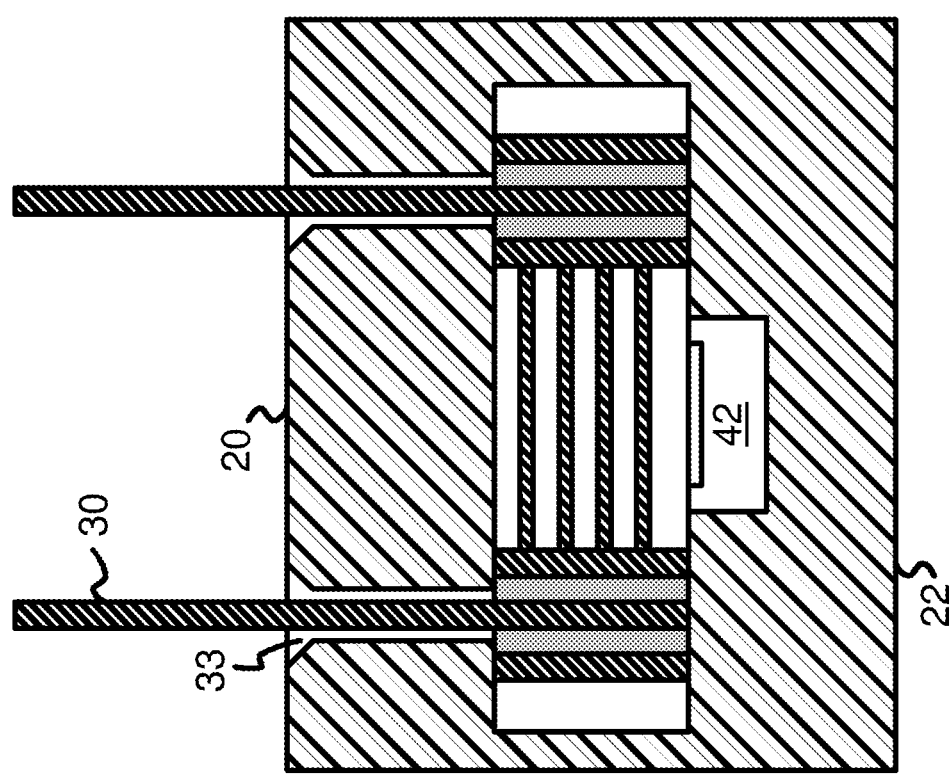
FIG. 12 is an alternative with epoxy filling a bevel cut at the top of the groove.

FIG. 12 is an alternative with epoxy filling a bevel cut at the top of the groove. The bevel cut for groove 34 provides for an easy application of a filler, such as an epoxy, into groove 34. Epoxy 33 may extend down from the opening of groove 34 to fill groove 34 down to PCB 50. Epoxy 33 may also only partially fill groove 34. Epoxy 33 further anchors terminal pins 30 into groove 34. Reliability may be further enhanced by epoxy 33.

Figure 13:
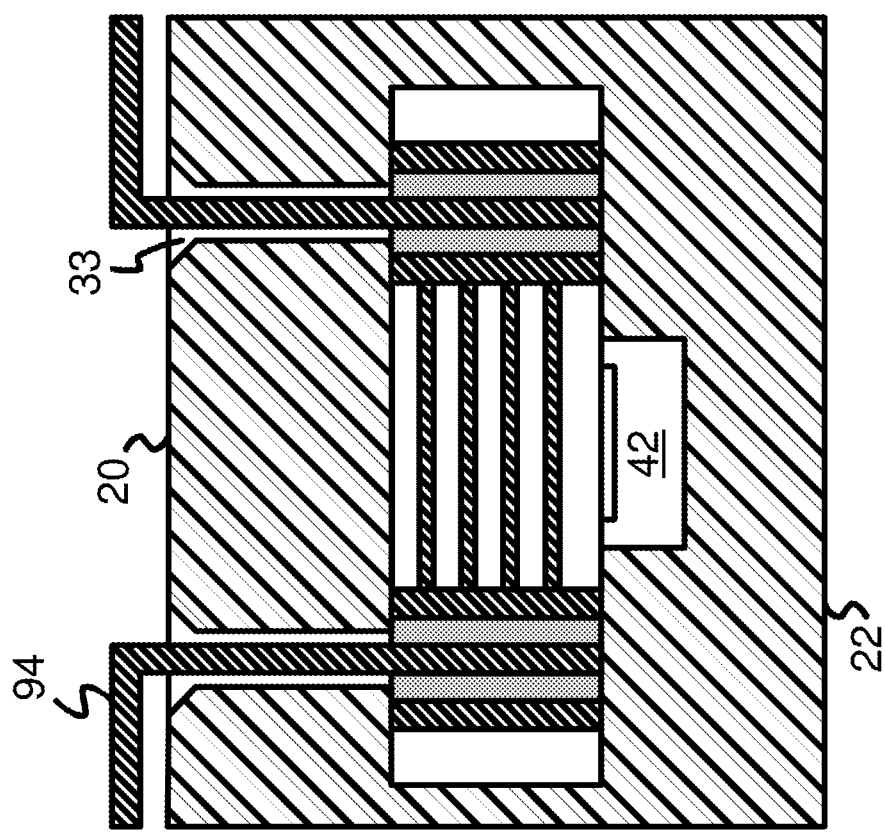
FIG. 13 is an alternative with bent surface-mount terminal pins.

FIG. 13 is an alternative with bent surface-mount terminal pins. Surface-Mount Technology (SMT) pins 94 replace terminal pins 30. The bend in the top of SMT pins 94 allows for surface mounting the module to a large board or system. Epoxy 33 and a bevel cut may or may not be combined with SMT pins 94.

FIGS. 14A-14B is an alternative with two holes in the terminal pins. In FIG. 14A, hole 31 is formed in terminal pin 30, near the bottom of terminal pin 30 where terminal pin 30 fits inside the conductive slot. Another hole 35 is formed in a wider tab portion of terminal pin 30, above the level PCB 50.

In FIG. 14B, when terminal pin 30 is inserted into groove 34 and into the conductive slot, hole 31 contacts embedded solder 32. When embedded solder 32 is heated to reflow and form the solder joint, some of embedded solder 32 flows into hole 31. The final solder joint may be stronger due to the anchoring effect of embedded solder 32 within hole 31.

Epoxy 33 may also flow into second hole 35. The epoxy in second hole 35 further anchors terminal pins 30, providing further resistance to lateral forces than might bend terminal pins 30 and break or crack the solder joints with conductive slot metal 44.

ALTERNATE EMBODIMENTS

Several other embodiments are contemplated by the inventors. For example, groove 34 may be narrower that the conductive slots or may be the same width. Groove 34 may be centered over the conductive slots or may be offset from center. One groove 34 may connect to many conductive slots for many terminal pins, or groove 34 may be separated into many grooves.

The encapsulant does not have to completely encapsulate PCB 50 and the components 42. As shown in FIGS. 5, 8, 9, conductor-free corner regions 88 of PCB 50 are exposed and not covered by the encapsulant of top molding 20, bottom molding 22, and molding interlock 26. However, all components 42 are encapsulated, except for any components 42 that are designed to extend through the encapsulant, such as a lens end of a LED component. In FIGS. 5, 8, 9, conductor-free corner regions 88 of PCB 50 are exposed and not covered by the encapsulant cold be portions of a ferrite inductor. After singulation of the panel PCB into plurality of modules, the sides of the module except on the corner at conductor-free corner regions 88 are covered with encapsulant, preventing the separation of top molding and bottom molding from the PCB.

Pre-formed plastic molds for top molding 20 and bottom molding 22 may also be used and heated, or other encapsulation techniques substituted. The assembly flow may be altered in various ways and steps may be combined or re-ordered in some situations or environments. For example, terminal pins 30 could be inserted into each module after separation, or terminal pins 30 could be inserted into multiple modules at the same time, before module separation, especially if a larger alignment jig is available. An automatic terminal pins attachment machine could be used with a flux dipping station and a bondhead heater for instant solder reflow. Forming molding interlock 26 from plastic extruded from top molding 20 and bottom molding 22 can provide for better encapsulation since there is not a seam between top molding 20 and bottom molding 22 as might occur when pre-molded parts are used for top molding 20 and bottom molding 22.

Encapsulation can be performed in a variety of ways, such as by fitting a top mold and a bottom mold around PCB 50, and then inserting hot plastic and applying pressure to squeeze the plastic around PCB 50 to form top molding 20, bottom molding 22, and molding interlock 26. A potting process may be used wherein the PCB is placed in a mold and then a liquid encapsulant epoxy is dispensed inside the mold.

Sawing groove lines 80 and singulation lines 82 could be performed at the same time, or on the same apparatus, reducing time and costs. Specialized equipment to solder terminal pins 30 is not needed when using embedded solder 32. Pre-molded flange and terminal pin assemblies are not needed.

Although not considered ideal, the saw cut for singulation lines 82 could have a limited depth, or be a score line, and a bending force applied to crack the remaining board under the saw cut when separating modules.

More than one of conductive layers 46 may be connected to conductive slot metal 44, such as all four metal layers for a 4-metal-layer PCB, to provide for a larger current, or to improve reliability in case one of the connections should break. Some terminal pins and their conductive slots may only connect to 2 or 3 of conductive layers 46. Since embedded solder 32 is applied earlier in the process, solder does not have to be applied to terminal pins 30 just before attachment. Embedded solder 32 may be applied when solder is applied for other purposes, such as to attach components 42.

Components 42 may include semiconductor or IC devices of various kinds, transistors, diodes, passive electronic components such as resistors, capacitors, resistor packs, inductors, transformers, and other components such as connectors, jumper wires, posts, handles, guides, mechanical supports, and mechanical devices.

In FIG. 7B, embedded solder 32 may also be located on the top surface of PCB 50, around the conductive slot. Conductive slot metal 44 or other metal could extend from inside the connecting slot and bend 90 degrees along the surface of PCB 50. Solder placed on this top surface of PCB 50 could flow into the connecting slot along conductive slot metal 44 during heating in step 116 (FIG. 6B). This allows for a larger opening that terminal pin 30 can fit into while still providing enough solder to fill the slot and form a larger, strong solder bond. Solder could similarly be placed on the bottom surface of PCB 50 near the connecting slots.

Conductive slot metal 44 has been shown as being formed on sidewalls of the hole in the PCB formed by the conductive slot. Conductive slot metal 44 may be formed by copper via plating and then do surface finish plating using gold, silver, tin, nickel, or various alloys. Conductive slot metal 44 may be formed in a similar manner to formation of vias between conductive layers 46. The conductive slot copper wall may be plated with gold, tin, nickel or other metals by means of electroplating, immersion, electroless, etc., to enhance the solder reflow wetting capability.

While terminal pins 30 have been shown as being placed into two grooves 34 on two sides of a top surface of the module, terminal pins 30 could be placed along only 1 side, or along all 4 sides. One groove 34 could be formed on the top surface and one groove 34 could be formed on the bottom surface of the module, and terminal pins 30 could extend both above the top surface and below the bottom surface of the module.

While embedded solder 32 has been described as being applied to conductive slot metal 44, solder could be applied to terminal pins 30 before insertion into the groove and conductive slot for wide grooves. When the groove is narrow, it may not be possible to fit the solder paste dispensing nozzle into the groove, so this variation is less desirable.

Metal pad 92 may be deleted and terminal pin 18 can be directly soldered to one or more of conductive layers 46 without metal pad 92. to attached when the solder is heated.

Terms such as up, down, top, bottom, side, above, under, horizontal, vertical, inside, outside, are relative and depend on the viewpoint and are not meant to limit the invention to a particular perspective. Devices may be rotated so that vertical is horizontal and horizontal is vertical, so these terms are viewer dependent.

The background of the invention section may contain background information about the problem or environment of the invention rather than describe prior art by others. Thus, inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A module with internally-anchored pins comprising:
    a Printed Circuit Board (PCB) having insulating board layers sandwiched between conductive layers that are patterned to form wiring traces;
    a plurality of components mounted to the PCB, the plurality of components including at least one semiconductor device;
    a plurality of conductive slots in the PCB, each conductive slot being surrounded by conductive slot metal that is electrically connected to the wiring traces in the conductive layers of the PCB;
    an encapsulant around the PCB and the plurality of components;
    a groove formed through a top portion of the encapsulant and formed over the plurality of conductive slots;
    a plurality of terminal pins, each terminal pin in the plurality of terminal pins inserted into the groove and into a conductive slot in the plurality of conductive slots;
    a plurality of embedded solder joints between the plurality of terminal pins and the conductive slot metal in the plurality of conductive slots;

wherein a top end of each terminal pin extends above the groove and above the encapsulant and is exposed for bonding the module to an external system;

wherein a lower end of each terminal pin is attached to the conductive slot metal by one of the plurality of solder joints, wherein the lower end of each terminal pin is embedded within the module and protected from external shorting by the encapsulant, whereby the plurality of terminal pins are internally anchored to the PCB by the plurality of embedded solder joints and protected from external side shorts.

2. The module with internally-anchored pins of claim 1 wherein the groove extends a full length of the encapsulant, the groove dividing the top portion of the encapsulant into a center portion and an end portion;

wherein the end portion of the encapsulant acts as a side barrier to protect the plurality of terminal pins from contacting external conductors on a side of the module.

3. The module with internally-anchored pins of claim 1 wherein an end PCB portion of the PCB between the plurality of conductive slots and a side edge of the PCB has no metal wiring traces formed therein;

wherein the end PCB portion without metal wiring traces reduces shorting to external conductors on a side of the module.

4. The module with internally-anchored pins of claim 1 wherein the plurality of embedded solder joints is formed by a process of applying embedded solder to the conductive slot metal before the encapsulant is formed around the PCB, and heating after the encapsulant is formed and the plurality of terminal pins are inserted into the groove and plurality of conductive slots.

5. The module with internally-anchored pins of claim 1 further comprising:

encapsulant channel slots formed on all side edges of the PCB, wherein the encapsulant channel slots are filled with the encapsulant to form a molding interlock between the top portion of the encapsulant and a bottom portion of the encapsulant;

wherein the encapsulant channel slots are aligned to singulation lines;

wherein a panel PCB is separated into a plurality of the PCB for the module by sawing the panel PCB along the singulation lines.

6. The module with internally-anchored pins of claim 5 further comprising a conductor-free corner region of the PCB having no wiring traces, the conductor-free corner region having a corner touching an intersection of two of the singulation lines that are perpendicular to each other.

7. The module with internally-anchored pins of claim 6 wherein the encapsulant is a plastic molding and the top portion is a top molding.

8. The module with internally-anchored pins of claim 7 wherein the PCB comprises at least four conductive layers and at least three insulating board layers.

9. The module with internally-anchored pins of claim 8 wherein the plurality of components comprise at least one semiconductor Integrated Circuit (IC).

10. The module with internally-anchored pins of claim 9 wherein the plurality of components include top components mounted to a top surface of the PCB encapsulated by the top portion of the encapsulant, and bottom components mounted to a bottom surface of the PCB encapsulated by a bottom portion of the encapsulant.

11. The module with internally-anchored pins of claim 1 wherein each terminal pin has a lower hole in a terminal pin;

wherein the plurality of embedded solder joints further comprises solder within the lower hole in the terminal pin.

12. The module with internally-anchored pins of claim 1 further comprising:

epoxy disposed within the groove between the plurality of terminal pins and the encapsulant.

13. The module with internally-anchored pins of claim 12 wherein each terminal pin has an upper hole in a terminal pin;

wherein epoxy is disposed within the upper hole in the terminal pin.

14. The module with internally-anchored pins of claim 1 wherein each terminal pin has a 90-degree bend in an upper portion that extends above the groove, wherein the plurality of terminal pins are surface-mount pins for surface-mounting the module to an external system.

15. The module with internally-anchored pins of claim 1 wherein the groove further comprises a bevel formed on a top surface of the encapsulant, wherein a cross-sectional area of the bevel formed on the top surface is larger than a cross-sectional area of the groove below the top surface.

16. A pin-protecting module comprising:

a Printed Circuit Board (PCB) having at least two conductive layers that are patterned;

Integrated Circuit (IC) components mounted on the PCB;

a top molding that covers a top surface of the PCB;

a bottom molding that covers a bottom surface of the PCB;

a molding interlock that at least partially covers sides of the PCB and connects to the top molding and to the bottom molding;

a conductive slot formed in the PCB;

conductive slot metal formed around a perimeter of the conductive slot, the conductive slot metal electrically connected to at least one of the conductive layers in the PCB;

a groove formed in the top molding, the groove formed above and aligned to the conductive slot;

a terminal pin having a lower end placed in the conductive slot, an upper end above the top molding, the upper end of the terminal pin exposed for electrical connection to an external system, the terminal pin having a middle disposed within the groove; and an embedded solder joint between the lower end of the terminal pin and the conductive slot metal;

wherein the lower end and the middle of the terminal pin are protected from physical contact with an external shorting conductor by the top molding surrounding the groove.

17. The pin-protecting module of claim 16 further comprising:

a PCB end formed between the conductive slot and the molding interlock, the PCB end having no metal traces patterned in the at least two conductive layers of the PCB;

wherein the PCB end insulates the lower end of the terminal pin from the external shorting conductor.

18. A method for manufacturing a module comprising:

receiving a panel Printed Circuit Board (PCB) having encapsulant channel slots along singulation lines and having conductive slots along groove lines, and having electronic components mounted thereon;

encapsulating the panel PCB with a top molding and a bottom molding that connect together at molding interlocks formed within the encapsulant channel slots;

cutting the panel PCB along the groove lines and along the singulation lines, wherein the groove lines are cut to a reduced depth that cuts through the top molding without cutting through the bottom molding to form a groove, and the singulation lines are cut fully through the top molding and the bottom molding and the molding interlock;

separating the panel PCB after encapsulation into a plurality of modules separated by the singulation lines;

applying solder flux to lower ends of terminal pins and inserting the lower ends of the terminal pins through the groove and into the conductive slots; and applying heat to cause embedded solder placed on conductive slot metal in the conductive slots to flow and form solder joints between the conductive slot metal and the lower ends of the terminal pins.

19. The module made by the method of claim 18.

20. The method of claim 18 further comprising:

applying the embedded solder to the conductive slot metal before encapsulating the panel PCB with a top molding and a bottom molding.

\* \* \* \* \*